United States Patent [19]

Nishibayashi et al.

[11] Patent Number: 5,162,886
[45] Date of Patent: Nov. 10, 1992

[54] HALL DEVICE

[75] Inventors: Yoshiki Nishibayashi; Hideaki Nakahata; Hiromu Shiomi; Naoji Fujimori, all of Hyogo, Japan

[73] Assignee: Sumitomo Electric Industries Ltd., Osaka, Japan

[21] Appl. No.: 697,441

[22] Filed: May 9, 1991

[30] Foreign Application Priority Data

May 21, 1990 [JP] Japan ................. 2-131590

[51] Int. Cl.$^5$ ............. H01L 29/66; 357 25; 357 27
[52] U.S. Cl. ..................... 257/421; 357/25; 428/336; 428/408; 428/469; 428/697; 428/698; 428/701; 428/704
[58] Field of Search ............ 428/408, 336, 698, 204, 428/697, 701, 702, 469; 357/25, 27

[56] References Cited

U.S. PATENT DOCUMENTS 4,783,368 11/1988 Yamamoto et al. ............. 428/408
4,863,529 9/1989 Imai et al. ..................... 437/103

FOREIGN PATENT DOCUMENTS 0254560 1/1988 European Pat. Off. .
57-121288 7/1982 Japan .
60-127293 7/1985 Japan .

OTHER PUBLICATIONS

Geis, "Growth of Textured Diamond Films on Foreign Substrates from Attached Seed Crystals" Appl. Phy. Lett vol. 55(6) 1989.
Spitsyn et al., "Vapor Growth of Diamond on Diamond & Other Surfaces" Journ. of Cry. Growth, 52(1981).
Farabaugh et al., "Growth of Diamond Films by Hot Filament CVD" SPIE vol. 969 Diamond Optics (1988).

Primary Examiner—Ellis P. Robinson
Assistant Examiner—Archene Turner

[57] ABSTRACT

A Hall device having an active part made from semiconductor diamond. The Hall device works even at high temperature or in corrosive atmosphere. Boron doped diamond is suitable for controlling the acceptor concentration.

10 Claims, 1 Drawing Sheet

HALL DEVICE

FIELD OF THE INVENTION

This invention relates to a Hall device which works stably under severe conditions, e.g. at high temperature more than 200° C., under the radiation of radioactive ray, in the atmospheres including acid, alkali or corrosive gases.

BACKGROUND OF THE INVENTION

To measure the strength of magnetic field, usually a Hall device which utilizes the Hall effect of semiconductor is used.

When a current and a magnetic field are applied to a semiconductor in the directions which meet at right angles with each other, a voltage is induced to a direction which is vertical both to the directions of the current and the magnetic field. The effect is called "Hall effect". The induced voltage is in proportion to the product of the current and the magnetic field. Then, the strength of magnetic field is known from the induced voltage when the current is kept to be a constant, known value. The proportion constant of the induced voltage to the product of the current and the magnetic field is called a "Hall coefficient". In general, the Hall coefficient is in inverse proportion to the carrier concentration in the semiconductor. The induced voltage is often called a Hall voltage. So far, the Hall devices are made from the semiconductors, gallium arsenide (GaAs), indium arsenide (InAs) or indium antimony (InSb). These semiconductors are gifted with high carrier mobilities; 8600 cm$^2$/Vs electron for GaAs, 25000 cm$^2$/Vs electron for InAs and 76000 cm$^2$/Vs electron for InSb at room temperature. The high carrier mobilities can induce high Hall voltages in the Hall measurement. Thus, by employing these semiconductors with high carrier (electron or hole) mobilities to the material of the Hall devices, we can obtain excellent Hall devices with high sensitivity to magnetic field. Therefore, the Hall devices made from GaAs, InAs, or InSb have been widely used in various fields to measure the strength of magnetic field.

It is said that low carrier concentration in the semiconductor is desirable to heighten the sensitivity of the Hall devices to the magnetic field. Usually, the semiconductors with the carrier concentration between $10^{15}$ cm$^{-3}$ and $10^{16}$ cm$^{-3}$ are used to the material of the Hall devices.

The performance of Hall device is estimated by the "Hall mobility" which is defined as a product of the conductivity and the Hall coefficient. The Hall coefficient is inversely proportional to the carrier concentration as mentioned before. The aforementioned semiconductors, i.e. InSb, InAs or GaAs have been considered as the most preferable materials for the Hall devices, because of their high Hall coefficients and high carrier mobilities. The band gaps at room temperature of GaAs, InAs, and InSb are 1.45 eV, 0.35 eV and 0.18 eV respectively. These semiconductors are quite useful if the Hall devices are used at room temperature. However, if the Hall device would be used at high temperature, these semiconductors would become incompetent by two reasons.

One of the reasons relates to the width of the band gap. The other relates to the thermal problems.

InAs and InSb are totally in the "intrinsic region" at the temperature higher than 500° C., because of the small band gaps. The instrinsic region signifies the region in which the electron concentration and the hole concentration are nearly equal each other. In general, semiconductors are classified into three kinds, e.g. n-type, intrinsic, or p-type semiconductors. The n-type semiconductors have electrons as majority carriers and the p-type semiconductors have holes as majority carriers. The intrinsic semiconductors have both electrons and holes with nearly same concentrations.

The Hall effect occurs only when either electrons or holes exist in the semiconductor. When both electrons and holes coexist in the semiconductor, no Hall voltage is induced because the voltage induced by the electrons is fully cancelled by the voltage induced by the holes. The electron-induced voltage is inverse to the hole-induced voltage, because the voltages derive from the Lorentz force which is in proportion to the product of the electronic charge, the velocity and the magnetic field. Thus, the semiconductor available for the Hall device must be either an n-type or a p-type semiconductor with low carrier concentration.

Therefore, the semiconductors InSb and InAs show no Hall effect above 500° C., because they are intrinsic there. The devices made from InSb or InAs cannot be used as Hall device above 500° C.

The semiconductor GaAs has a wider band gap (1.45 eV) than InAs (0.35 eV) or InSb (0.18 eV). The "intrinsic carrier" concentration in GaAs is nearly $10^{15}$ cm$^{-3}$ at 500° C. and nearly $10^{16}$ cm$^{-3}$ at 700° C. If the dopant concentration in GaAs would be settled to be higher than $10^{17}$ cm$^{-3}$, the Hall devices made from the GaAs would still work at nearly 700° C. despite the deterioration of sensitivity. Here, intrinsic carrier concentration is defined as a square root of the product of electron concentration and hole concentration, which is a common value with an n-type, p-type or intrinsic semiconductor. The intrinsic carrier concentration depends only on the temperature and the band gap. The intrinsic carrier concentration increases according to the rising of temperature. Narrower band gap leads to the higher intrinsic concentration. If the dopant concentration prevails over the intrinsic carrier concentration, the semiconductor can be still either an n-type or a p-type semiconductor.

However, thermal problems further restrict the function of the GaAs Hall devices at high temperature. Above 500° C., the crystalline structure of GaAs is likely to collapse. The chemical and physical properties of GaAs become unstable. Thus, electronic property becomes also unstable. Therefore, the GaAs Hall devices lack stability and endurance at high temperature more than 500° C.

The purpose of this invention is to provide a Hall device which can be used at high temperature.

Another purpose of this invention is to provide a Hall device which works under severe conditions.

SUMMARY OF THE INVENTION

The Hall device of this invention comprises a sensing portion, a pair of electrodes fitted on the sensing portion for applying a current to the sensing portion, a pair of electrodes fitted on the sensing portion for detecting an induced voltage along a direction vertical to the applied current, characterized in that the sensing portion is made from a semiconductor diamond.

Preferably the Hall device of this invention comprises a diamond substrate, a sensing portion made of a semiconductor diamond grown on the diamond substrate, a pair of electrodes fitted on the sensing portion for applying a current to the sensing portion, a pair of electrodes fitted on the sensing portion for detecting an induced voltage along a direction vertical to the applied current. The geometric shape or size as a Hall device is arbitrarily designed. The numbers of electrodes are three, four, five or so.

Diamond is inherently an insulator. However, the diamond doped with some dopant becomes a p-type semiconductor or an n-type semiconductor. For example, the diamond doped with boron (B) is a p-type semiconductor. However, the carrier mobility of semiconductor diamond is lower than that of InSb. The semiconductor diamond has been deemed inappropriate as the material of Hall devices. Thus a Hall device made from the semiconductor diamond has not been produced nor even proposed yet.

Diamond has a wide band gap (5.5 eV). Thus even at high temperature, diamond does not enter into the intrinsic region. The intrinsic region of diamond semiconductor exists above 1400° C. Below the temperature, diamond can be assigned to be either an n-type or a p-type semiconductor.

The intrinsic region of semiconductor means the region of temperature in which the electron concentration is equal to the hole concentration. The n-type or p-type semiconductor is obtained by doping an n-type dopant or a p-type dopant. The n-type dopant is an impurity which supplies a free electron in the semiconductor. The p-type dopant is an impurity which supplies a free hole in the semiconductor. Non-doped semiconductor without impurity is in principle an intrinsic semiconductor. The product (pn) of the electron concentration (n) and the hole concentration (p) is common regardless of the type of semiconductor. The square root of the product (pn) is called intrinsic carrier concentration (h). Schematically speaking, the n-type semiconductor is defined by $n >> h >> p$ and $np = h^2$, the p-type semiconductor is defined by $p >> h >> n$ and $np = h^2$ and the intrinsic semiconductor is defined by $n = p = h$. The intrinsic carrier concentration (h) is given by $$h = (\text{const}) \times T^{3/2} \times \exp(-Eg/2kt)$$

where T is the absolute temperature, Eg is the band gap and k is the Boltzmann constant.

According to the rising of temperature, the intrinsic carrier concentration (h) increases. If the semiconductor has a narrow band gap, the intrinsic carrier concentration (h) rapidly increases according to the rising of temperature. When the intrinsic carrier concentration (h) prevails over the dopant concentration (n-type or p-type), the semiconductor enters into the intrinsic region, although the semiconductor was doped with some dopant atoms. When the semiconductor stays in the intrinsic region, no Hall effect occurs, because voltage induced by holes conceals the voltage induced by electrons. Rigorously speaking, the temperature at which the semiconductor enters into the intrinsic region depends on the dopant concentration. The higher the dopant concentration is, the higher the temperature at which the intrinsic region begins is.

But the carrier concentration supplied by the dopant is saturated at a certain value of the dopant concentration in general. The concentration of carriers supplied by the dopant cannot increase over the saturated carrier concentration. Thus if the intrinsic carrier concentration (h) attains to the saturated carrier concentration, the number of electrons becomes nearly equal to the number of holes regardless of the type of semiconductor.

Then the semiconductors with a narrower band gap enter into the intrinsic region at lower temperature. On the contrary, diamond has a wide band gap. By choosing the doping amount, the semiconductor diamond can be designed not to enter into the intrinsic region below 1400° C. In other word, the semiconductor diamond can be either a p-type semiconductor or an n-type semiconductor up to 1400° C. Thus the Hall device made from the semiconductor diamond shall be able to work as far as 1400° C. This is the most important feature of the device of the invention. However, this invention has other advantages besides it.

Diamond is thermally very stable, because strong covalent bonds between carbon atoms effectively protect the diamond structure against the lattice vibration induced by thermal agitation.

Diamond is chemically so stable that it is not corroded by acid, alkali or other corrosive material.

Therefore, the Hall device made from diamond works stably at high temperature less than 1400° C. in the corrosive atmosphere. It excels in the endurance, heat resistance, and acid or alkali resistance.

Furthermore, the heat diffusivity of diamond is 20 W/cm K, which is more than ten times as big as that of semiconductor silicon. Because of the high heat diffusivity, the input current is able to be heighten. High input current heightens the sensitivity to magnetic field, because the sensitivity of a Hall device is in proportion to the input current.

Unlike silicon, since non-doped diamond is an insulator, an active diamond layer is electrically separated from the diamond substrate without additional intermediate layers when the active diamond layer doped with some dopant has been grown on the insulating, non-doped diamond substrate.

Furthermore, the active diamond layer can be covered with a non-doped additional diamond layer, because the non-doped diamond is an insulator. In this case, the covering diamond layer acts as an protective film. Of course, other protective layers, e.g. aluminum nitride (AlN), boron nitride (BN), silicon dioxide ($SiO_2$) are also available. However, the diamond protective layer is superior to the other passivation layers, because the thermal expansion of the layer is equal to that of the active layer and that of the substrate.

By these reasons, this invention can alleviate the thermal problems on fabricating a Hall device. The Hall device provided by this invention works well with high output power at high temperature.

A diamond layer can be grown on a substrate from material gas by the various chemical vapor phase deposition methods as follows;

(1) The method for activating the material gas by the electric discharge induced by the direct current electric field or the alternative current electric field, (2) The method for activating the material gas by heating a filament for emitting thermal electrons, (3) The method for bombarding the surface of the substrate by accelerated ions, (4) The method for exciting the material gas by the laser light or ultraviolet ray, and (5) The method for burning the material gas.

All the methods for growing a diamond layer can be applied to this invention.

The material gas for growing the diamond layer comprises at least hydrogen gas and the gases including carbon compounds. If necessary, the gases including oxygen, rare gases or dopant gas are added to the material gas. The carbon compounds which is able to be used to synthesize the diamond layer are;

(1) paraffine hydrocarbons ... methane, ethane, propane, buthane etc.
(2) oreffine hydrocarbons ... ethylene, propylene, buthylene, etc.
(3) acetylene hydrocarbons ... acetylene, anniline, etc.
(4) dioreffine hydrocarbons ... buthadiene, etc.
(5) alicyclic hydrocarbons ... cyclopropane, cyclobuthane, cyclopenthane, cyclohexane
(6) aromatic hydrocarbons ... cyclobuthadiene, benzene, toluene, xylene, naphthalene, etc.
(7) ketones ... acetone, diethylketone, benzophenone, etc.
(8) alcohols ... methanol, ethanol
(9) amines ... trimethylamine, triethylamine
(10) carbon dioxide ($CO_2$)
(11) carbon monoxide (CO)

One or more than one of these carbon compounds is used as an ingredient of the material gas to produce the Hall device of this invention. Instead of the carbon containing compounds, the materials consisting only of carbon, e.g. graphite, coal and coke are also available for the material gas.

Besides hydrogen gas and the carbon compounds, the oxygen containing compounds may be included into the material gas. Here the oxygen containing compounds signify oxygen gas, water, carbon monoxide, carbon dioxide or hydrogen peroxide.

The rare gas is argon, helium, neon, krypton, xenon or radon. The dopants for determining the conduction type of diamond semiconductor are boron (B), lithium (Li), nitrogen (N), phosphor (P), sulphor (s), chlorine (Cl), arsenide (As) or selenium (Se). By mixing the gas including these elements into the material gas, the dopant is doped into the diamond layer growing on the substrate. The electric resistivity of the diamond layer is arbitrarily controlled by the amount of doping. In the case of doping nothing, the grown diamond becomes an insulator.

The advantages of the Hall device of this invention will now be explained again. First, the Hall device of this invention is an useful sensor for detecting magnetic field which can work at high temperature under severe conditions, e.g. acid, alkali or corrosive atmosphere. Especially, the Hall device can safely be used as far as 500° C. This is partly because diamond does not enter into the intrinsic region at 500° C. owing to the wide band gap. Even at the high temperature near 500° C., the intrinsic carrier concentration (h) is very small, either electrons or holes can be the majority carriers which carry electric currents. The concentration of the majority carriers is far greater than the intrinsic carrier concentration. Then the Hall effect does occur. Furthermore, diamond structure is so strong that the thermal agitation cannot break down the lattice structure even at high temperature.

Second, the Hall device of this invention is safely used under corrosive atmosphere, because diamond is chemically stable.

Because of the high heat diffusivity, the diamond excels in heat radiation. Owing to the excellent heat radiation, the input current can be increased. In general, the sensitivity of a Hall device is in proportion to the input current. The sensitivity of the Hall device of this invention is easily raised by increasing the input current.

Although it is inferior to the conventional InSb Hall device regarding the carrier mobility, the Hall device of this invention is gifted with these advantages.

DETAILED DESCRIPTION OF THE EMBODIMENTS

Figure 1:
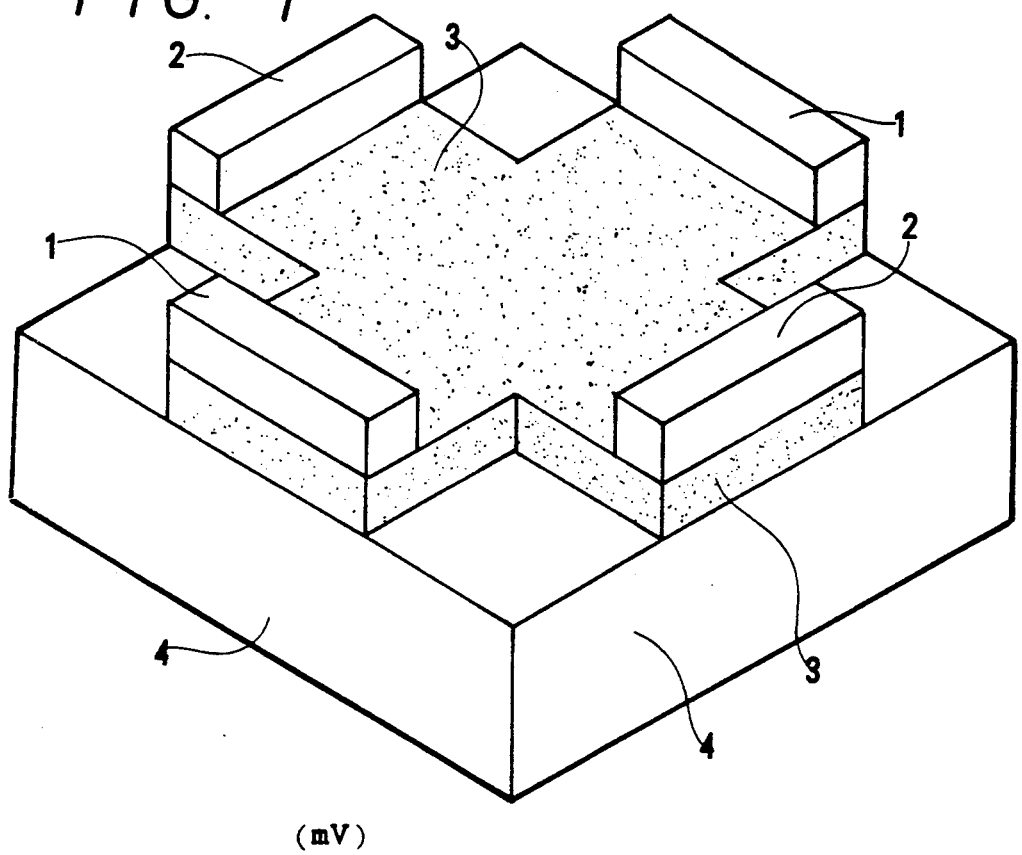
FIG. 1 is a schematical, perspective view of a Hall device as an embodiment of this invention.

FIG. 1 shows a Hall device of an embodiment. The Hall device comprises a substrate (4), a diamond layer (3), a pair of electrodes (1) and another pair of electrodes (2). The substrate (4) was a diamond single crystal. The boron doped diamond layer (3) was grown to 1.0 μm in thickness on the diamond single crystal substrate (4) by the microwave plasma CVD method. The diamond layer (3) was also a single crystal. Four corners of the boron doped diamond layer (3) were etched in squares by the plasma etching method. Thus the diamond layer (3) became a cross-shaped layer. Ohmic contact electrodes (1) and (2) were deposited on the extending portions of the cross-shaped diamond layer covered by a metal mask with the slots by the electron bean evaporation coating method. Since these electrodes (1) and (2) must become in ohmic contact with the diamond layer (3), titanium (Ti), molybdenum (Mo) and gold (Au) were deposited on this sequence up to 0.2 μm, 0.1 μm and 0.1 μm in thickness on the diamond layer (3).

A pair of electrodes (1) and (1) on opposite sides are the electrodes by which the input current is introduced into the diamond layer (3). Another pair of electrodes (2) and (2) on the another opposite sides are the electrodes by which the Hall voltage induced by the current and the magnetic field shall be measured.

Passivation layers were also deposited on the diamond layers (3) to protect it from external contamination. The passivation layers were made from, e.g. SiN, BN, TiN, AlN, $Al_2O_3$, etc. However, the passivation layers are not shown in FIG. 1 to illustrate the active parts clearly. Of course, the chip of the diamond substrate was mounted on a pertinent package having lead pins, the electrodes (1) and (2) were connected to the corresponding lead pins by golden wires and the package was sealed by a cover.

Figure 2:
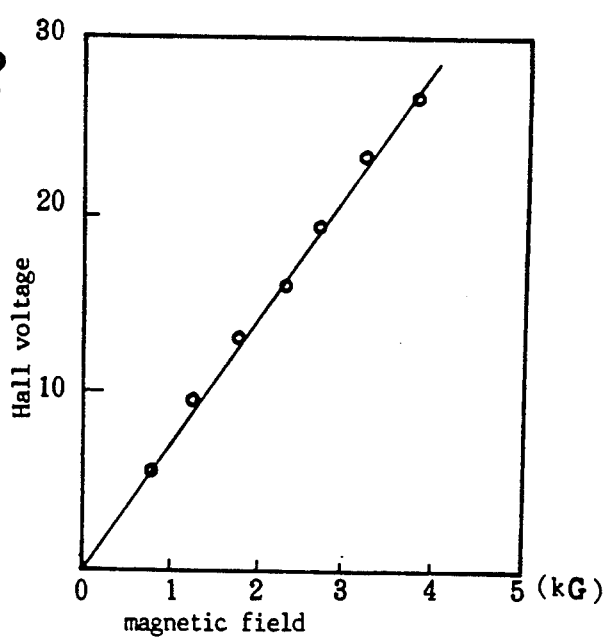
FIG. 2 is a graph showing the Hall voltage induced on the embodiment with an input current of 1 mA at 300° C. as a function of the magnetic field.

FIG. 2 shows the result of measuring the Hall voltage as a function of the magnetic field of the Hall device of FIG. 1. The abscissa is the magnetic field (k gauss). The ordinate is the Hall voltage (V) induced in the device. The input current was 1 mA. The Hall voltage was induced lineally with regard of the magnetic field applied. This result shows that the device of FIG. 1 is effectively able to be used as a Hall device.

The electromagnetic properties of the device was not changed after it had been left in a week in the atmosphere of the vapor of hydrofluoric acid. This result of the test proved the excellent chemical stability of the device. It was confirmed that the Hall device of this invention will work with high stability at high temperature or in a corrosive atmosphere by other tests.

Regarding the substrate, a diamond single crystal substrate is the most suitable in order to deposit single crystalline diamond layers on it. However, the devices using aluminum nitride (AlN), alumina (Al$_2$O$_3$), silicon nitride (Si$_3$N$_4$), silicon dioxide (SiO$_2$). boron nitride (BN) or other insulators as the substrate exhibited almost the same performances as the device with the diamond single crystal substrate. But the diamond layers deposited on these non-diamond insulators were not single crystals but polycrystals.

The semiconductor diamond layer as an active part was the diamond doped with the dopants, e.g. beryllium (Be), boron (B), phosphor (P), arsenide (As), sulfur (S) or selenium (Se) in order to convert it to a p-type or an n-type of semiconductor. Especially, the p-type diamond doped with boron (B) was preferable since the acceptor concentration is able to be precisely controlled.

The electrodes by which a current is introduced in the diamond layer or by which a Hall voltage is measured may be fabricated either by a mono-element metal, by an alloy including more than two kinds of metals or by strata of more than two kinds of metals. In any cases, it is preferable that the upper surfaces of the electrodes are coated with gold (Au), platinum (Pt) or other metals with high acid resistance.

Regarding the number of electrodes, the devices with either three electrodes, four electrodes or five electrodes exhibited the same performance as Hall devices. Although the embodiment shows the example of four electrodes, other devices with three electrodes or five electrodes can similarly be fabricated according to the teaching of this invention.

The structure of the three electrode types is obtained by omitting one of the pair of the electrodes for sensing the Hall voltage. Even in the three electrode type, applying a current between two opposite electrodes, we can measure the Hall voltage induced between the middle electrode and one of the opposite electrode for supplying the current.

The device of the five electrode type has three electrodes arranged in a straight line with the same distances for supplying currents. The currents flow from the two end electrodes to the central electrode. The two extra electrodes are positioned at the corners of the isosceles triangles whose bottom corners coincide with the electrodes for supplying the current. A Hall voltage appears between the two extra electrodes. The Hall voltage is twice as much as that of the case of the three electrodes.

The size of the device of this invention can arbitrarily be designed according to the purpose or utility.

Since the device of this invention has an active portion made from diamond semiconductor, it works with high sensitivity even at high temperature even in corrosive atmosphere. The thickness of the diamond layer is 0.2 $\mu$m to 50 $\mu$m.

What we claim is:

1. A Hall device comprising:
   a monocrystalline substrate;
   a diamond active layer with a thickness of 0.2 $\mu$m to 50 $\mu$m grown on said monocrstalline substrate, said active layer being doped with at least one of boron, beryllium, phosphorus, arsenic, sulfur, or selenium; and
   two pairs of electrodes formed on said active layer.

2. A Hall device as claimed in claim 1, wherein said active layer is grown by a chemical vapor deposition method using a material gas including hydrogen gas and hydrocarbon and one of oxygen gas, water, carbon monoxide, carbon dioxide or hydrogen peroxide.

3. A Hall device comprising:
   a monocrystalline substrate;
   a diamond active layer with a thickness of 0.2 $\mu$m to 50 $\mu$m grown on said monocrstalline substrate, said active layer being doped with at least one of boron, beryllium, phosphorus, arsenic, sulfur, or selenium;
   two pairs of electrodes formed on said active layer; and
   a protective layer deposited on said active layer.

4. A Hall device as claimed in claim 3, wherein said protective layer is formed on non-doped diamond.

5. A Hall device as claimed in claim 1, wherein said protective layer is formed of one of silicon nitride, boron nitride, titanium nitride, aluminum nitride or aluminum oxide.

6. A Hall device as claimed in claim 1, 4 or 5 wherein said active layer is grown by a chemical vapor deposition method using a material gas including hydrogen gas and hydrocarbon and one of oxygen gas, water, carbon monoxide, carbon dioxide or hydrogen peroxide.

7. A Hall device as claimed in claim 1, 2, 3, 4 or 5, wherein said monocrystalline substrate is diamond.

8. A Hall device as claimed in claim 6, wherein said monocrystalline substrate is diamond.

9. A Hall device as claimed in 1, 2, 3, 4 or 5, wherein the monocrystalline substrate is one of aluminum nitride, aluminum oxide, silicon nitride or silicon dioxide.

10. A Hall device as claimed in 6, wherein the monocrystalline substrate is one of aluminum nitride, aluminum oxide, silicon nitride or silicon dioxide.

* * * * *